United States Patent

Batko et al.

[11] Patent Number: 6,082,894
[45] Date of Patent: Jul. 4, 2000

[54] TEMPERATURE AND PASSIVE INFRARED SENSOR MODULE

[75] Inventors: Thomas J. Batko, Wallingford; John R. Baldwin, Newtown, both of Conn.

[73] Assignee: Hubbell Incorporated, Orange, Conn.

[21] Appl. No.: 09/107,045

[22] Filed: Jun. 29, 1998

Related U.S. Application Data

[63] Continuation-in-part of application No. 08/705,778, Aug. 30, 1996, Pat. No. 5,772,326.
[51] Int. Cl.⁷ .......................... G01K 13/02; G01K 1/14; G08B 13/19
[52] U.S. Cl. .......................... 374/142; 374/138; 236/51; 236/DIG. 19; 250/342; 250/DIG. 1; 340/567
[58] Field of Search .................................. 374/142, 135, 374/138; 250/342, 349, DIG. 1, 339.04, 339.14; 340/567; 236/51, 47, DIG. 19

[56] References Cited

U.S. PATENT DOCUMENTS

| | | | |
|---|---|---|---|
| 4,301,682 | 11/1981 | Everest et al. | 73/355 R |
| 4,435,093 | 3/1984 | Krause et al. | 374/129 |
| 4,746,910 | 5/1988 | Pfister et al. | 340/567 |
| 4,924,096 | 5/1990 | Mroczowski et al. | 250/341 |
| 4,932,789 | 6/1990 | Egawa et al. | 374/126 |
| 5,008,775 | 4/1991 | Schindler et al. | 36/383 |
| 5,017,018 | 5/1991 | Iuchi et al. | 374/130 |
| 5,106,325 | 4/1992 | Robinson et al. | 439/540 |
| 5,115,967 | 5/1992 | Wedekind | 236/46 R |
| 5,127,575 | 7/1992 | Beerbaum | 236/46 R |
| 5,262,647 | 11/1993 | Kumada | 250/351 |
| 5,266,807 | 11/1993 | Neiger | 250/353 |
| 5,290,175 | 3/1994 | Robinson et al. | 439/540 |
| 5,327,047 | 7/1994 | Gershen | 315/194 |
| 5,336,979 | 8/1994 | Watson et al. | 315/362 |
| 5,395,042 | 3/1995 | Riley et al. | 236/46 R |
| 5,402,298 | 3/1995 | Gershen et al. | 361/50 |
| 5,406,436 | 4/1995 | Doyle et al. | 361/50 |
| 5,475,364 | 12/1995 | Kenet | 340/522 |
| 5,477,412 | 12/1995 | Neiger et al. | 361/45 |
| 5,479,812 | 1/1996 | Juntunen et al. | 73/3 |
| 5,485,058 | 1/1996 | Watson et al. | 315/194 |
| 5,509,108 | 4/1996 | Yeh | 395/114 |
| 5,525,846 | 6/1996 | Newell et al. | 307/125 |
| 5,627,518 | 5/1997 | Wishart | 340/567 |
| 5,640,143 | 6/1997 | Myron et al. | 340/541 |
| 5,670,943 | 9/1997 | DiPoala et al. | 340/567 |

FOREIGN PATENT DOCUMENTS

| | | |
|---|---|---|
| 0 341 022 A2 | 11/1989 | European Pat. Off. . |
| 8811566 | 12/1983 | Germany . |
| 63-261187 | 10/1988 | Japan . |
| 1-277796 | 11/1989 | Japan . |
| 4-128684 | 3/1992 | Japan . |
| 2 170 952 | 8/1986 | United Kingdom . |
| WO 81/00764 | 3/1981 | WIPO . |

*Primary Examiner*—G. Bradley Bennett
*Assistant Examiner*—Gail Verbitsky
*Attorney, Agent, or Firm*—Jerry M. Presson; William C. Roch

[57] ABSTRACT

A temperature and passive infrared sensor module in which a temperature sensor is mounted so as to not be adversely affected by heat generating electrical components of the sensor module. One embodiment comprises a wallswitch-mounted unit which is designed to be mounted in a wallswitch electrical outlet box with a semi-cylindrical front of the sensor projecting forwardly therefrom. A top section of the projecting semi-cylindrical front has a front curved window, behind which a passive infrared sensor and an ambient light sensor are positioned. A bottom section of the projecting semi-cylindrical front is formed by a removable clip-in door which is provided with air flow vents in a bottom surface and also in projecting front and side surfaces thereof to provide a circulating air flow around a temperature sensor. The temperature sensor and the passive infrared sensor are mounted on a front electrical-lead side of a vertically positioned PC board, and heat generating electrical components are mounted on an opposite, back component side of the PC board. A second embodiment comprises a round ceiling-mounted unit in which heat generating electrical components are mounted on one radial side of a circular PC board, and the temperature sensor is mounted on the opposite radial side thereof circular PC board, as far away therefrom as possible. A shield is also provided to section off and isolate the temperature sensor.

16 Claims, 11 Drawing Sheets

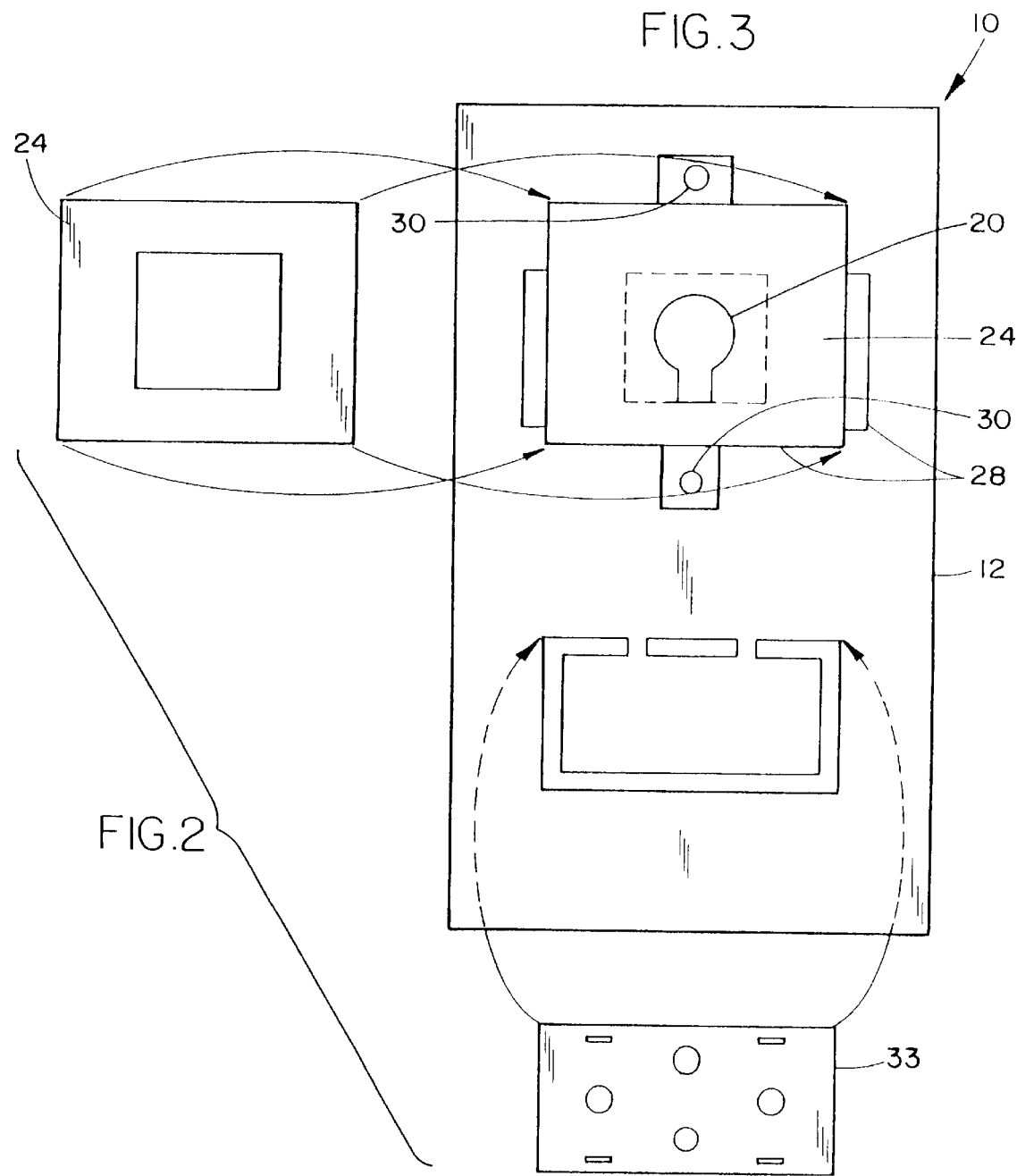

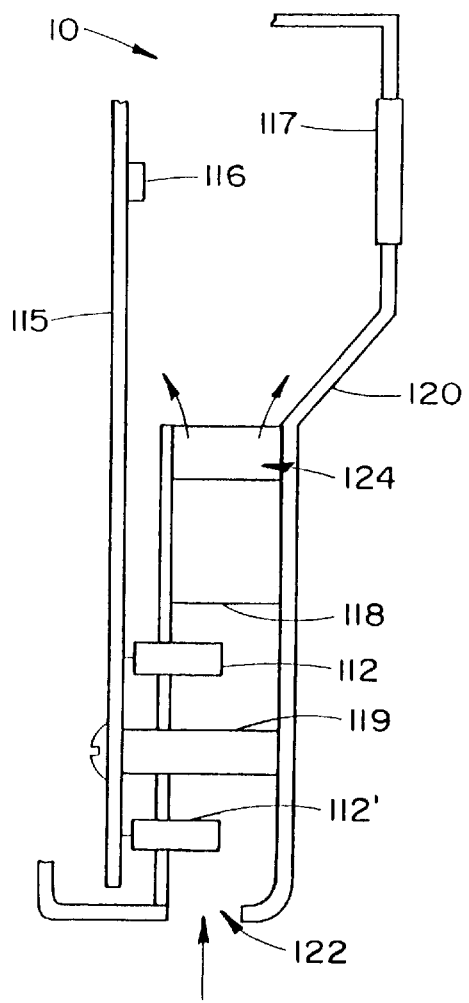
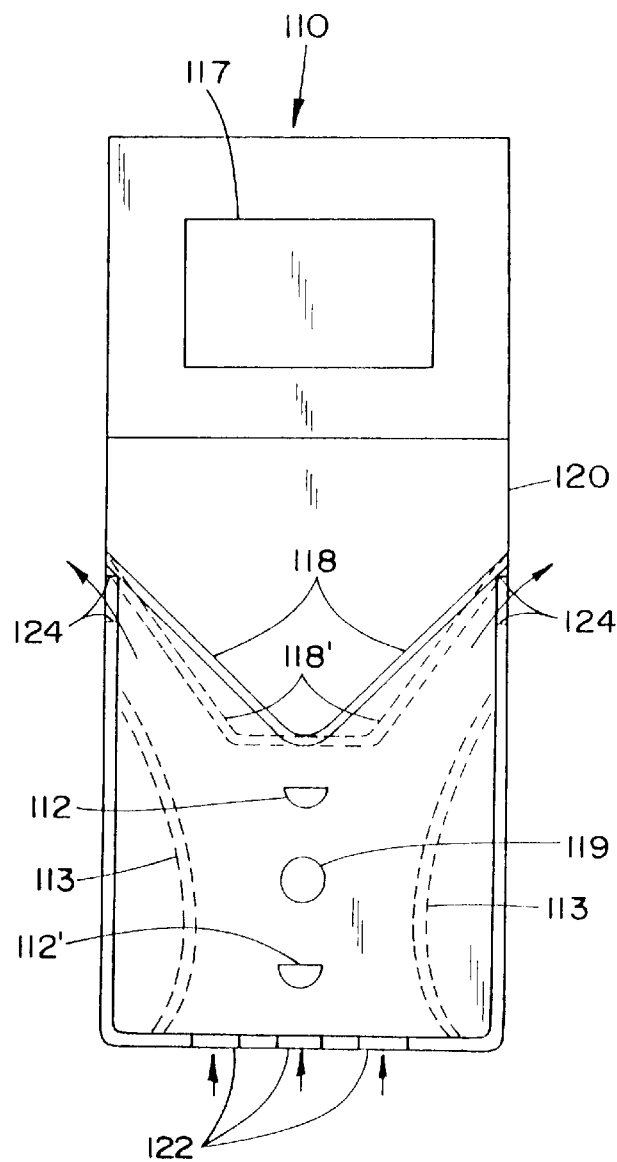
FIG. 11
FIG. 10

TEMPERATURE AND PASSIVE INFRARED SENSOR MODULE

This patent application is a continuation-in-part application of U.S. patent application Ser. No. 08/705,778, filed Aug. 30, 1996, now issued U.S. Pat. No. 5,772,326.

BACKGROUND OF THE INVENTION

1. Field of the Invention

The present invention relates generally to a temperature and passive infrared sensor module, and more particularly pertains to a temperature and passive infrared sensor module as might be utilized in an occupied space networked environment, such as an automated office building, in which sensors are installed to sense and control various parameters therein. The sensors can include an occupancy sensor, such as a passive infrared (PIR) sensor or an ultrasonic sensor, a temperature sensor, an ambient light sensor, a relative humidity sensor, a $CO_2$ sensor, a CO sensor, a security sensor, and other parameter sensors.

It is desirable to provide a plurality of such parameter sensors in one sensor module which can interface through a system bus with one or more microprocessor control systems to control operation of the lighting systems, climate control systems, fire alarm systems, etc. in the occupied space networked environment. Such microprocessor control systems and devices are available commercially which incorporate networking such as, an Echelon LONWORKS system or, CE Bus, BacNet, etc.

However, the mounting and exposure requirements of the diverse parameter sensors in a sensor module are often quite different, such that it is difficult to mount the diverse sensors in a common sensor module. For instance, a temperature sensor should be mounted to be open and exposed to a flow of air from the environment of a room being monitored, while a passive infrared occupancy sensor should be mounted so as not to be exposed to a flow of air from the environment of the room being monitored. Moreover, heat generating components within the sensor module should also be positioned to have as little adverse effect as possible upon the temperature sensor and the PIR sensor. The temperature sensor should also be insulated or shielded from direct exposure to and heat loading from sunlight.

SUMMARY OF THE INVENTION

Accordingly, it is a primary object of the present invention to provide a temperature and passive infrared sensor module in which a temperature sensor is mounted to be open and exposed to a flow of air from the environment of a room being monitored. The temperature sensor is also mounted to be adversely affected as little as possible or practical by heat generating electrical components within the sensor housing, while also being insulated and shielded from direct exposure to and heat loading from sunlight. A passive infrared sensor is also mounted therein so as not to be exposed to a flow of air from the environment of the room being monitored. The sensor module can be incorporated in a surface wall mounted unit, or a wallswitch mounted (recessed) unit, or a ceiling mounted unit.

A further object of the subject invention is the provision of temperature and passive infrared sensor module which can be used in a networked environment such as in an Echelon LONWORKS system, CE Bus, BacNet, etc.

The present invention recognizes that a certain amount of heat is generated by circuit components within the sensor housing, which should be dissipated while minimally adversely affecting and causing any error in the temperature measured by the temperature sensor. This results in a temperature offset between the actual ambient temperature and the measured temperature, which should be minimized. Major heat generating components include current limiting resistors and a voltage regulator.

One embodiment of the present invention is a wallswitch-mounted (mounted recessed in a wallswitch electrical outlet box) sensor, and a second embodiment is a ceiling mounted sensor.

In either a wall or wallswitch mounted sensor module, the locations of the temperature sensor and various heat generating components operating at higher temperatures, as well as air flow considerations, are critical in minimizing a temperature measurement offset between the temperature outside the sensor enclosure and the sensor reading. Performance is best with the major heat generating components located as high as possible on the PC board assembly and on the opposite side from the temperature sensor which is located near a bottom corner of the PC board. Increasing air flow up and through the enclosure and increasing the thermal isolation of the temperature sensor from the major heat generating components minimizes a temperature measurement offset. To the extent practible, the heat generating components are mounted as high as practical on the component side of the PC board, as heat rises, and the temperature sensor is mounted as far therefrom as possible, preferably at a bottom corner of the opposite, electrical-lead side of the PC board.

In a ceiling mounted sensor module, the location of the temperature sensor and the various heat generating components at higher temperatures, as well as air flow considerations, are critical in minimizing a temperature measurement offset between the temperature outside the sensor enclosure and the temperature sensor reading. Without a substantial vertical flow of air through the sensor housing as in a wall mounted unit, positioning of the sensor as far as possible from the major heat generating components is very important. There is no self-generating vertical air flow as in a wall mounted unit. Locating the sensor on the edge of the PC board in an area of maximum louver openings is also important.

In accordance with the teachings herein, the present invention provides a temperature and passive infrared sensor comprising a sensor housing having air flow vents therein to allow air to circulate through the sensor housing. A temperature sensor and a passive infrared sensor are mounted on a front electrical-lead side of a printed circuit board, which also defines an opposite back electrical component side. The printed circuit board is positioned vertically in the sensor module housing. The temperature sensor is mounted on a lower corner of the electric-lead side of the printed circuit board. Heat generating electrical components, such as current limiting resistors and a voltage regulator, are mounted on the back component side of the printed circuit board, such that the printed circuit board shields the temperature sensor and the passive infrared sensor from the heat generating components.

In one embodiment, the sensor is a wallswitch-mounted unit which is designed to be mounted in a wallswitch electrical outlet box, with a semi-cylindrical front of the sensor projecting forwardly therefrom. The present invention mounts the sensor in an aesthetically attractive housing which projects minimally from the front of wall switch box. The sensor is mounted within the wallswitch electrical outlet box by screws which extend through projecting lugs on a mounting bridge or yoke of the sensor into threaded openings in the outlet box.

A top section of the projecting semi-cylindrical front has a front curved window, behind which the passive infrared sensor and an ambient light sensor are positioned. A bottom section of the projecting semi-cylindrical front is formed by a removable clip-in door which is provided with air flow vents in a bottom surface and also in projecting front and side surfaces thereof to provide a circulating air flow around the temperature sensor. The temperature sensor is mounted on the printed circuit board to project into the enclosed space behind the clip-in door, and is preferably mounted at a bottom front corner of the printed circuit board, as far as practical from the heat generating electrical components, which are mounted near the top two thirds of the back component side of the PC board.

An LED, which signals motion detection and is also used in service operations, is positioned centrally between the upper window and the lower clip-in door.

Particularly in embodiments of the present invention which are open to a substantial flow of ambient venting air, a plastic conformal coating is preferably deposited over the printed circuit board and the components mounted thereon, to provide electrical and thermal insulation and physical protection for the coated components, provide thermal insulation for the passive infrared sensor, and to protect the coated components from moisture. The plastic conformal coating also assists in obtaining certification and approval by testing and rating agencies such as UL and CE.

A round ceiling-mounted embodiment of the present invention is provided with a circular mounting PC board. Major heat generating electrical components are mounted on one radial side of the circular PC board, and the temperature sensor is mounted on the opposite radial side thereof, as far away therefrom as possible. A shield is also provided in the unit housing to section off and isolate the temperature sensor from the heat generating electrical components. The temperature as measured at the ceiling will be an offset higher than the temperature at a lower position in the room, and so an offset is provided to allow for a correction of the temperature offset.

BRIEF DESCRIPTION OF THE DRAWINGS

The foregoing objects and advantages of the present invention for a temperature and passive infrared sensor module may be more readily understood by one skilled in the art with reference being had to the following detailed description of several preferred embodiments thereof, taken in conjunction with the accompanying drawings wherein like elements are designated by identical reference numerals throughout the several views, wherein the multifunction wallswitch sensor is particularly illustrated in FIGS. 13–18, and in which:

FIG. 2 is a front elevational view of the temperature and passive infrared sensor module shown in FIG. 1 with the front housing removed therefrom, and illustrates the mounting of the passive infrared detector therein surrounded by a foam block seal and enclosed by a lens retainer element;

FIG. 3 is a top plan view of the temperature and passive infrared sensor module shown in FIG. 2, and illustrates the temperature sensor and passive infrared sensor mounted on opposite sides of the printed circuit board therein;

FIGS. 10 and 11 are respectively schematic front elevational and side elevational views of a further embodiment of a temperature and passive infrared sensor module, and illustrate the mounting therein of a passive infrared detector and a temperature sensor and the circulation of air through the housing around the temperature sensor;

DETAILED DESCRIPTION OF THE DRAWINGS

Figure 1:
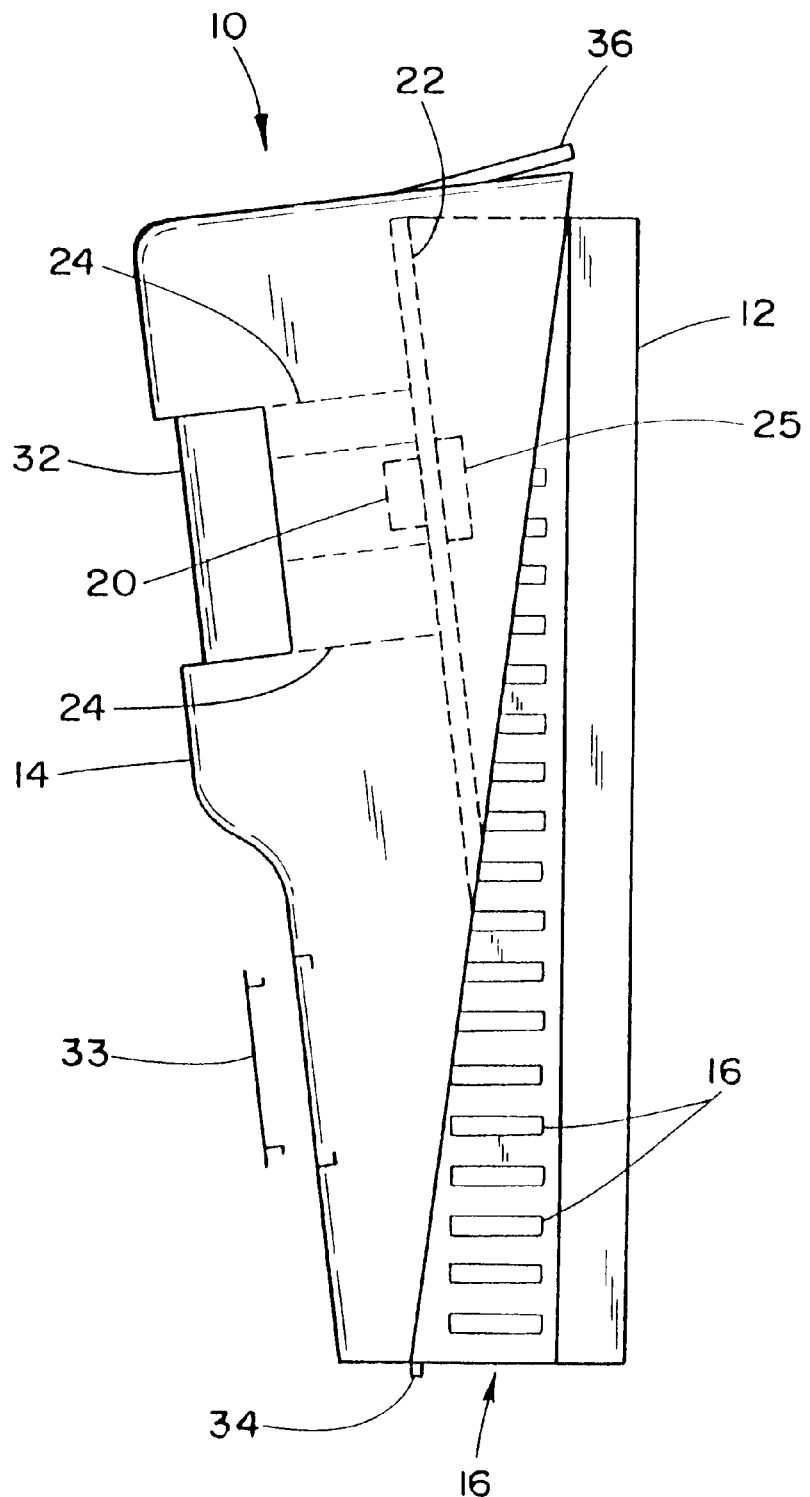
FIG. 1 is a side elevational view of a first embodiment of a temperature and passive infrared sensor module pursuant to the present invention.

Referring to the drawings in detail, FIG. 1 is a side elevational view of a first embodiment of a sensor module 10 pursuant to the teachings of the present invention. The sensor module 10 can incorporate therein a number of different parameter sensors such as a passive infrared sensor, an ultrasonic sensor, a temperature sensor, an ambient light sensor, a relative humidity sensor, a $CO_2$ system, a security sensor, and other parameter sensors.

The two sensors of particular interest to the development of the present invention are a passive infrared sensor and a temperature sensor. Passive infrared sensors are well known in the art and frequently comprise a segmented lens and an IR detector, and detect movement of IR sources within the field view of the detector. Temperature sensors are also well known in the art, and can include, for example, a temperature sensitive diode, thermistor, digital thermometer, etc. The mounting and exposure requirements of the passive infrared sensor and the temperature sensor are quite different, such that it is difficult to mount the two sensors in a common sensor module. The temperature sensor should be mounted to be exposed to a flow of air from the environment of a room being monitored, while the passive infrared sensor should not be exposed to a flow of air from the environment of the room being monitored. The temperature sensor should also be insulated or shielded from direct exposure to and heat loading from sunlight.

The sensor module 10 comprises a back housing member 12 which mounts to the wall of a room, and a front housing member 14 which mounts over the rear housing member 12. Air flow vents 16 are provided in top and bottom surfaces of the sensor module housing to provide a circulating air flow therein around the temperature sensor. Air flow vents 16 can also be provided in opposite side surfaces of the sensor module housing to provide additional circulating air flow around the temperature sensor.

FIG. 2 is a front elevational view of the sensor module 10 shown in FIG. 1 with the front housing 14 removed therefrom. FIG. 3 is a top plan view of the sensor module shown in FIG. 2, and illustrates a temperature sensor 18 and a passive infrared sensor 20 mounted on opposite sides of a printed circuit board 22 therein. The temperature sensor 18 is mounted in the sensor module housing in a position on the back of the PC board 22 which is open to air circulating through the sensor module housing. The passive infrared (PIR) sensor 20 is mounted in the sensor module housing, with a layer of insulating material surrounding and encasing it, such that it is not open to air circulating through the sensor module housing and is not adversely affected thereby.

The layer of insulating material can be a plastic molded encasement piece or a foam block 24 positioned on four sides surrounding the passive infrared detector 20. The passive infrared sensor 20 includes electrical leads extending thereto through the PC board 22, from the soldered side of the PC board. A separate 25 foam block can also be attached to the solder side of the PC board positioned on top of and around the electrical leads. A lens 26 is positioned in front of the passive infrared detector to focus infrared radiation thereon, and also prevents air which is circulating through the module housing from circulating around the passive infrared sensor. A lens retainer element 28 is provided for retaining the lens 26 securely in place, secured by screws 30, and the foam block 24 is positioned between the lens retainer element and the printed circuit board. The front housing member 14 also includes a window 32, through which the passive infrared detector views the environment surrounding the sensor module 10. A hinged coverbox or a snap-in door panel 33 can be used to provide mountings for switches, LEDs, etc., as is known in this art.

The printed circuit board 22 is fixedly mounted to and within the front housing member 14. The front housing member 14, and accordingly the printed circuit board also, is pivoted about a hinge 34 at the bottom end to adjust the angular field of view of the passive infrared sensor 20. At the top, the front housing member 14 includes a flexible tab 36 having a series of holes along its length, and a pin on the rear housing member 12 is snapped into one of the series of holes to adjust and maintain the angular view of the passive infrared detector 20.

Figure 4:
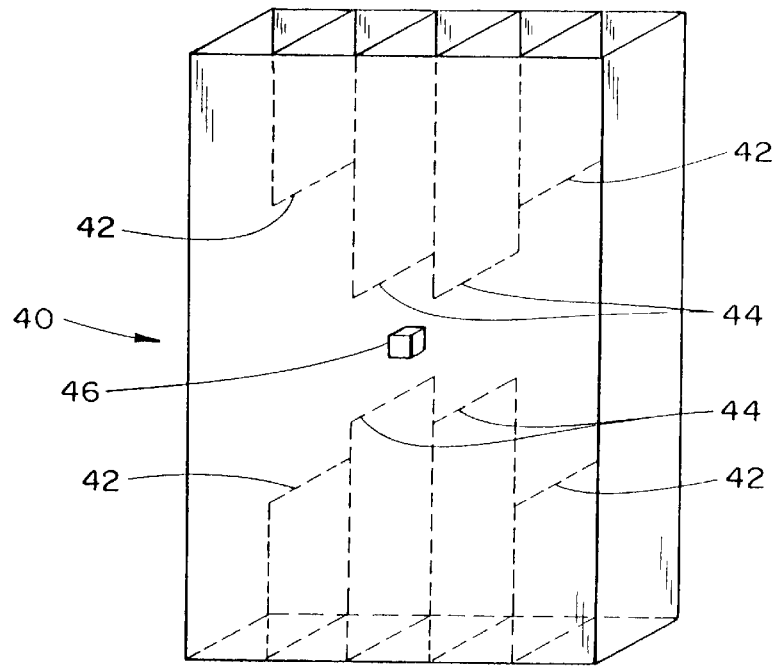
FIG. 4 is a front perspective view of a first embodiment of an air flow duct for enabling a flow of air to a temperature sensor mounted within a temperature and passive infrared sensor module.

FIG. 4 is a front perspective view of a first embodiment of an air flow duct 40 for controlling and directing a flow of air to a temperature sensor mounted within a sensor module. The air flow duct 40 would be positioned between air vents in the top and bottom surfaces of a sensor module, and includes variable length baffles 42 and 44 therein to control and channel the air flow to and around a temperature sensor 46 centrally mounted therein.

In alternative embodiments, the air flow duct could be completely open or channeled with different numbers and lengths of partitions, and can be an integral part of an occupancy sensor assembly housing or a separate insert therein. The air duct could be mounted on the PC board or on the sensor assembly housing. It can be used with a plastic foam seal to partition the section off, or with a suitable adhesive such as a plastic silicone cement such as RTV, or with mounting slots. The partitions can be used to channel air flow or to block parts or leads or components, such as the passive infrared detector, from the air flow. Some sections or channels could be filled with foam or other restrictive devices (e.g. a honeycomb) for temperature or electrical or mechanical isolation.

Figure 5:
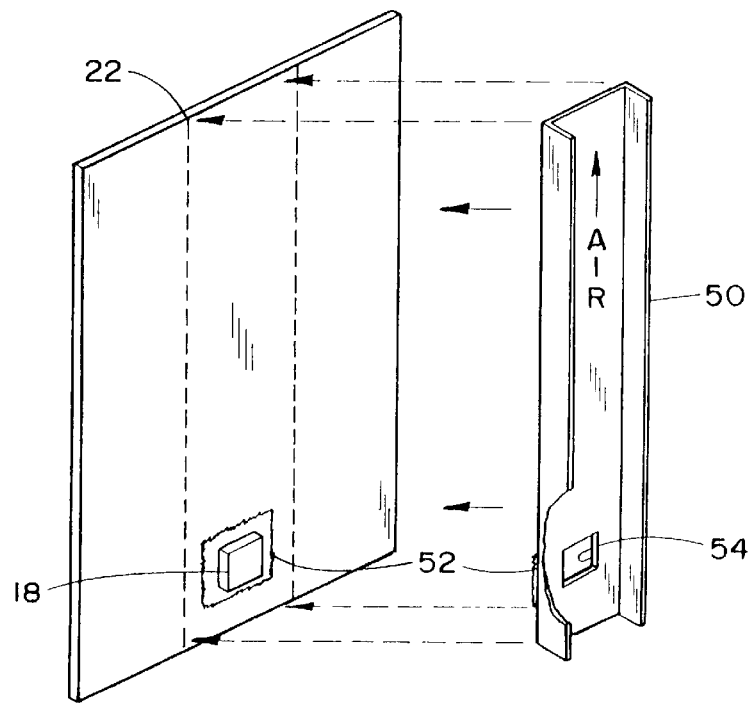
FIG. 5 is an exploded view of a second embodiment of an air flow duct for enabling a flow of air to a temperature sensor mounted on a printed circuit board within a temperature and passive infrared sensor module similar to that illustrated in FIGS. 1–3.

FIG. 5 is an exploded view of an embodiment of an air flow duct 50 for enabling a flow of air to a temperature sensor 18 mounted on a printed circuit board within a sensor module similar to that illustrated in FIGS. 1–3. The air flow duct 50 is designed to attach, as by glue, to the back housing 12 which closes the rear of the open duct illustrated in FIG. 5. Since the air flow duct 50 is attached to the back housing 12, and the angular position of the PC board 22 is adjustable relative to the back housing, via elements 34 and 36, the temperature sensor 18 is positioned nearer to the bottom end of the printed circuit board 22 to minimize movements between the air flow duct 50 and the temperature sensor 18 during such angular adjustments. Moreover, a layer of foam insulating material 52 is placed around the temperature sensor 18 by an aperture 54 in the air duct in which the temperature sensor 18 is positioned, to accommodate the angular adjustments. The air flow duct 50 is designed to minimize and Inhibit the flow of air in and through the product housing while directing it particularly around the temperature sensor 18, and could take many different shapes and designs.

Figure 6:
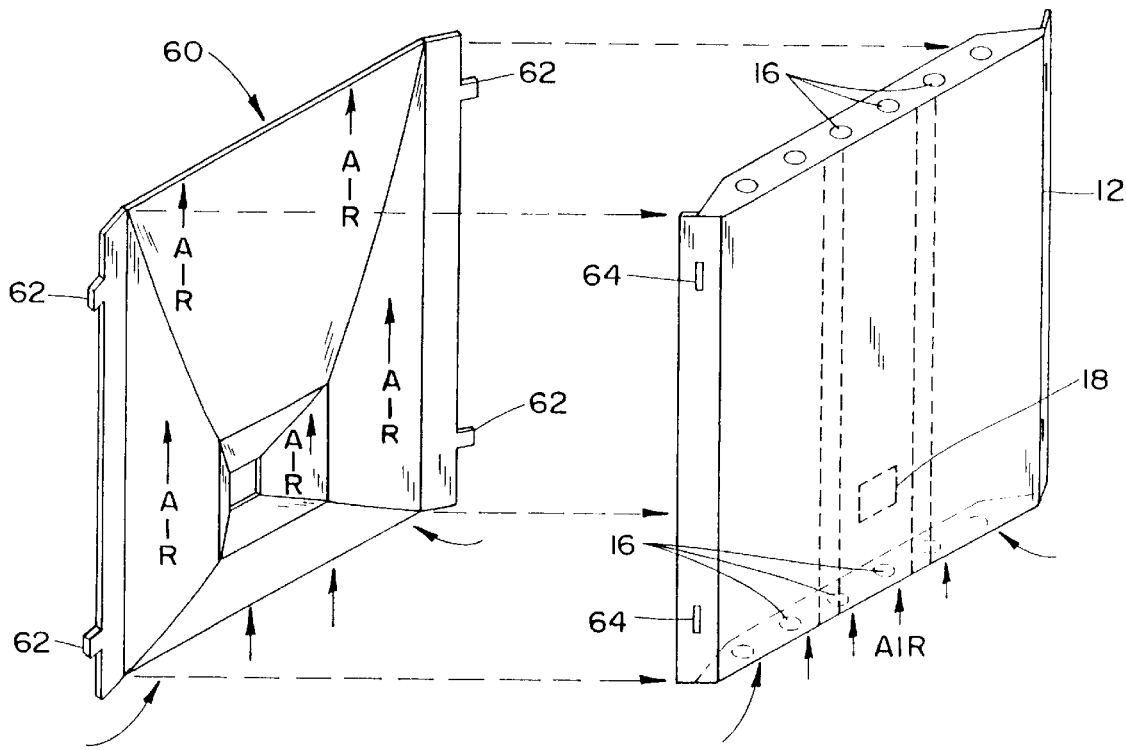
FIG. 6 is an exploded view of a third embodiment of an air flow duct for enabling the circulation of air to a temperature sensor mounted on a printed circuit board within a temperature and passive infrared sensor module similar to that illustrated in FIGS. 1–3.

FIG. 6 is an exploded view of another embodiment of an air flow duct 60 for enabling the circulation of air to a temperature sensor mounted on a printed circuit board within a sensor module similar to that illustrated in FIGS. 1–3. The design of air flow duct 60 is similar in principle to the design of air flow duct 50, but the air flow duct 60 is designed to provide a greater flow of air around the temperature sensor 18 and covers substantially the entire side of the printed circuit board on which the temperature sensor is mounted. The air flow duct 60 can be vacuum molded, and can include clips 62 to clip into apertures 64 in the back housing 12, or can be glued thereto. As illustrated in FIG. 6, air flow is provided between air vents 16 in the top and bottom of the back housing 12. The design Provides a flow of circulating air only through the duct 60 around the temperature sensor 18 and other electrical components mounted on that side of the PC board, but not through the rest of the housing and particularly not around the passive infrared detector 20. In this embodiment the passive infrared sensor and temperature sensor are mounted on opposite sides of the printed circuit board, such that air circulates around the temperature sensor on one side of the printed circuit board, but does not circulate around the passive infrared sensor on the opposite side of the printed circuit board.

The embodiments of FIGS. 1–3, 5 and 6 have the temperature sensor and the PIR sensor mounted on opposite sides of the PC board.

Figure 7:
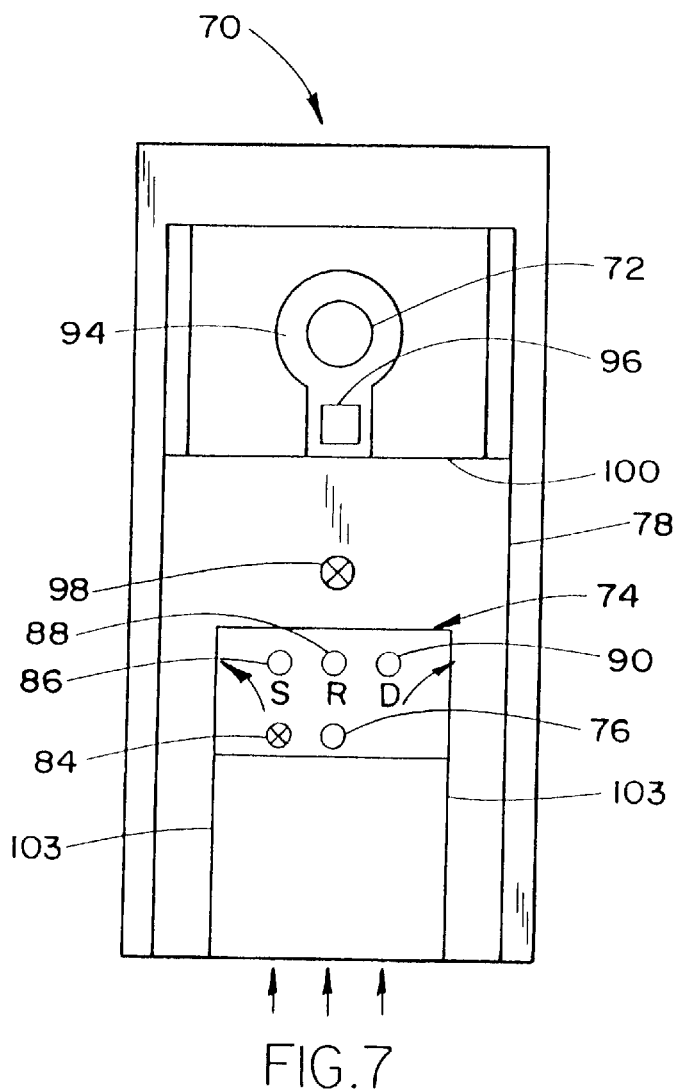
FIGS. 7 and 8 are respectively schematic front elevational and bottom views of a further embodiment of a temperature and passive infrared sensor module, and illustrate the mounting therein of a passive infrared detector and a temperature sensing module.
Figure 8:
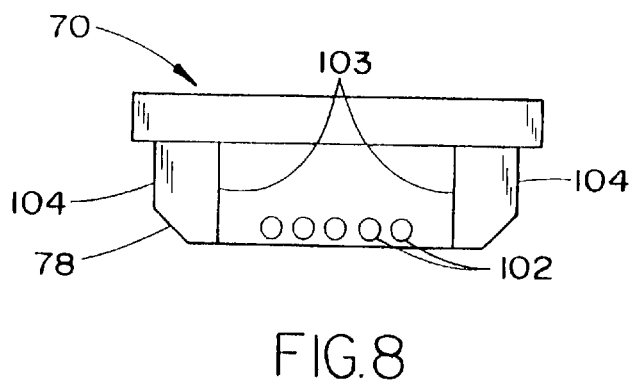
Figure 9:
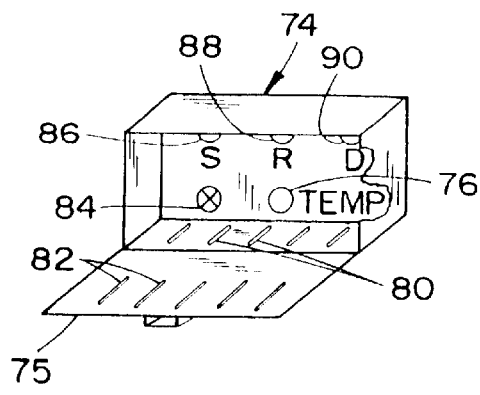
FIG. 9 is a front perspective view of only the temperature sensing module shown in FIG. 8.

FIGS. 7 and 8 are respectively schematic front elevational and bottom views of a further embodiment of a sensor module 70, and illustrate the mounting therein of a passive infrared detector 72 and a temperature sensing module 74. FIG. 9 is a front perspective view of only the temperature sensing module 74 shown in FIG. 7. FIG. 9 illustrates the temperature sensor module 74 with a front door 75 open, while FIG. 7 does not show the front door 75. The front door 75 is normally shut and is positioned at the front of sensor module 70, such that the air vents 82 therein open directly to the ambient atmosphere in front of the sensor module 74. In this embodiment, the temperature sensor 76 is mounted in the small enclosed module 74 which is mounted in the front of the sensor module housing 78, and the small enclosed module 74 includes air flow vents in an inside bottom surface at 80 and also near the top front on the outside thereof at 82 to allow air to circulate therein and around the temperature sensor 76. The module 74 is of a design generally known in the prior art (without the temperature sensor 76 mounted therein), and is provided for service functions. The module 74 provides the following service functions, a service LED 84, a service push-button switch 86, a reset push-button switch 88, and a daylight push-button switch or potentiometer 90. FIGS. 7 and 9 illustrate a modified arrangement of these known service functions wherein the temperature sensor 76 and air flow vents 80 and 82 have been added to the module. The service module 74 can clip onto the front housing member 78.

The sensor module 70 illustrated in FIG. 7 also includes a lens 94 positioned in front of the passive infrared sensor 72, an ambient light detector 96 positioned next to the passive infrared 72, and a motion detector LED 98. In this embodiment, the passive infrared sensor 72 and temperature sensor 76 are positioned on the same front side of the printed circuit board, and a partition 100 is provided between the passive infrared sensor 72 and the temperature sensor module 74 to prevent air circulating around the temperature sensor from reaching and circulating around the passive infrared sensor. The sensor module housing 78 includes air flow vents in a bottom surface at 102 and air flow duct surfaces 103 on opposite sides extending upwardly therefrom to the module 74, such that air flows through the bottom vents 102, is channeled upwardly by the ducts 103 to flow through the bottom vents 80 in the module 74, flows around the temperature sensor 76, and then flows up and out though the top front ducts 82, such that the air is vented through the ducts 82 directly to the atmosphere outside and in front of the sensor module housing 78. The temperature sensor module 74 is positioned in the sensor module housing 78 centrally between the air flow vents 102 in the bottom surface and the top front ducts 82.

Instead of module circuit block functions, and based upon cost and performance considerations, in alternative embodiments a multi-channel ADC convertor can be used with individual discrete sensor circuits such as a thermistor or photocell. However, the module block functions allow future possible population or depopulation device/function configurations to be made easily.

FIGS. 10 and 11 are respectively schematic front elevational and side elevational views of a further embodiment of a sensor module 110, and illustrate the mounting therein of a passive infrared detector 116 on a PC board 115 behind a lens 117 and the circulation of air through the housing around a temperature sensor 112. The PC board 115 is mounted to the front module housing by screws and mounting bosses, one of which is illustrated at 119. In this embodiment the temperature sensor 112 can be mounted below a service module which is similar to service module 74 but not provided with a temperature sensor or vent holes. The passive infrared sensor 116 and temperature sensor 112 are positioned on the same front side of the printed circuit board 115, and a V shaped partition 118 between the passive infrared sensor 116 and the temperature sensor 112 prevents air circulating around the temperature sensor from reaching and circulating around the passive infrared sensor 116. The sensor module housing 120 includes air flow vents in a bottom surface at 122 and air flow vents in opposite side surfaces at 124 of the sensor module housing 120, and the temperature sensor 112 is positioned in the sensor module housing 120 centrally between the air flow vents 122 in the bottom surface and the air flow vents 124 in the opposite side surfaces. FIGS. 10 and 11 illustrate an alternative mounting position for the temperature sensor at 112'. Moreover, an alternative partition 118' is shown in phantom for embodiments wherein the temperature sensor is mounted below a service module. Moreover, possible side duct walls are illustrated in phantom at 113 for a more directed flow of air around the temperature sensor.

Figure 12:
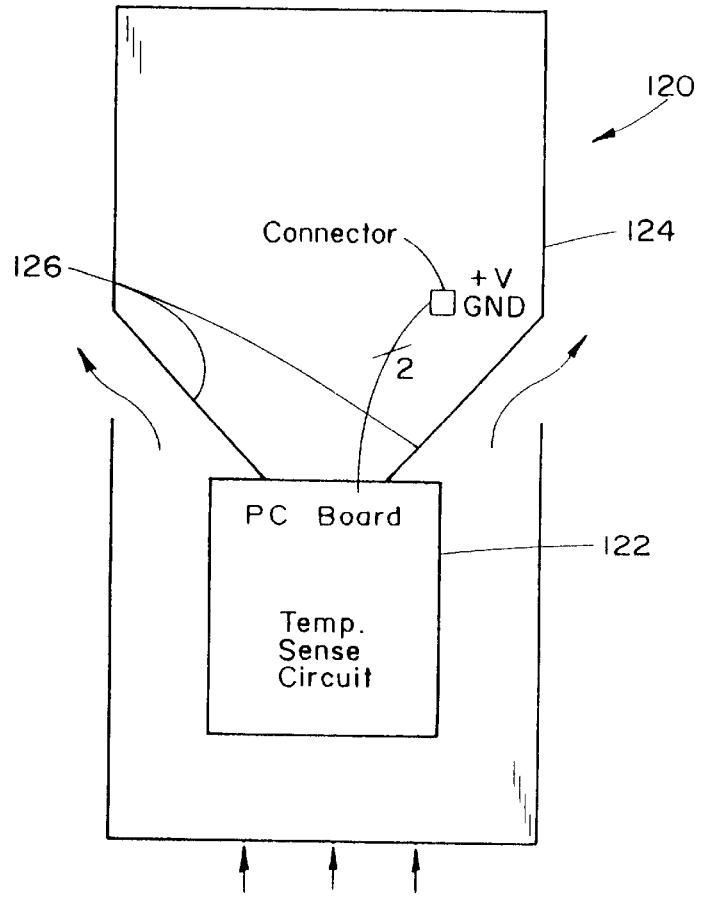
FIG. 12 is a schematic front elevational view of a further embodiment of a temperature and passive infrared sensor module in which a separate temperature sensing circuit board is installed within an existing product housing.

FIG. 12 is a schematic front elevational view of a further embodiment of a sensor module 120 which has a separate temperature sensing printed circuit board 122 installed within an existing product housing 124. The temperature sensor is mounted on the separate temperature sensor printed circuit board 122 which is positioned in the sensor module housing centrally between air flow vents in a bottom surface of the sensor module housing and air flow vents on the sides of the sensor module housing. A V-shaped partition 126 separates the temperature sensor PC board 122 from the PIR sensor which is mounted in the top portion of the housing 124. A connector (2 in) and digital or analog output could be provided as flying leads to a connector or header or terminal block or RJ11 telephone connector.

The embodiments of FIGS. 7–11 have the temperature sensor and the PIR sensor mounted on the same side of the PC board.

Figure 13:
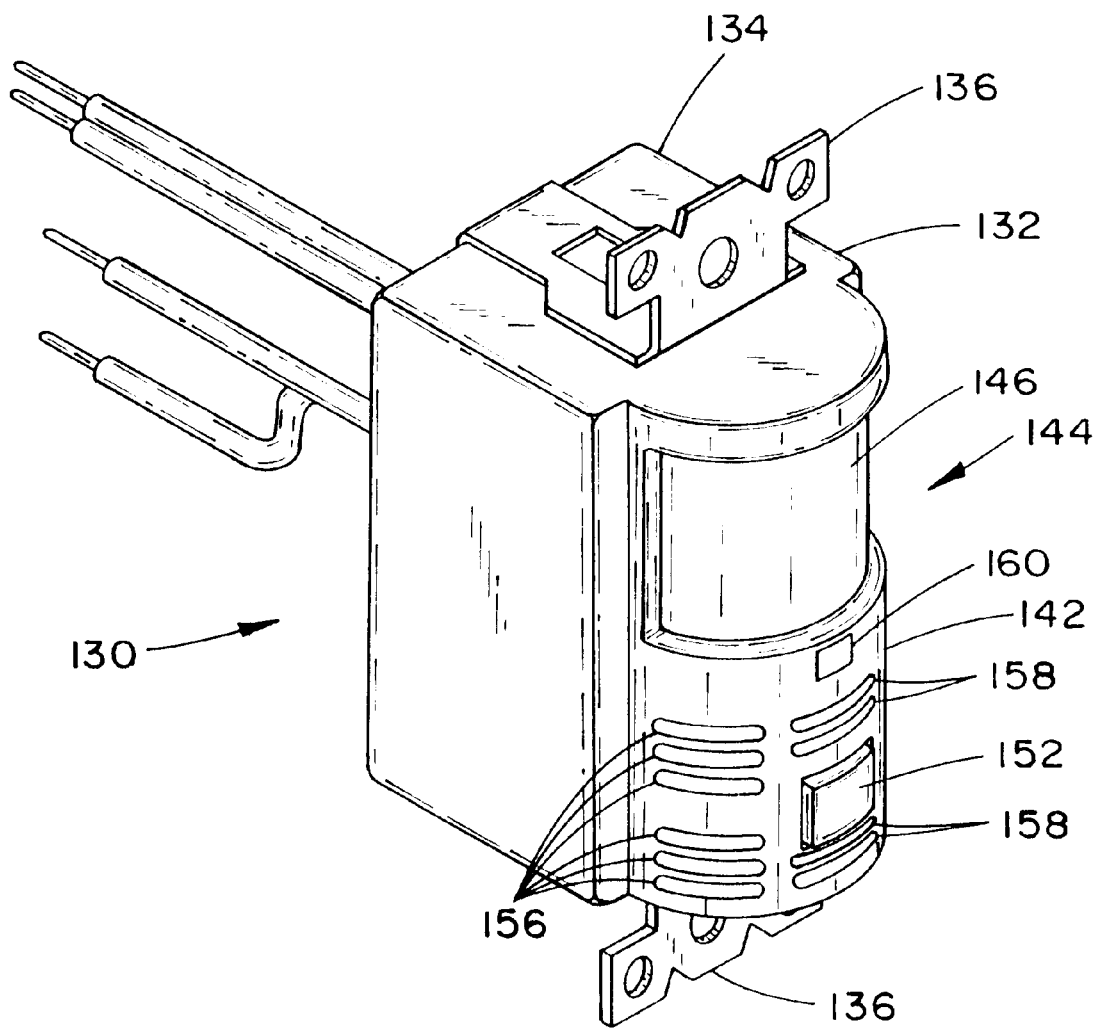
FIG. 13 is a front perspective view of a wallswitch-mounted temperature and passive IR sensor unit pursuant to the present invention.
Figure 14:
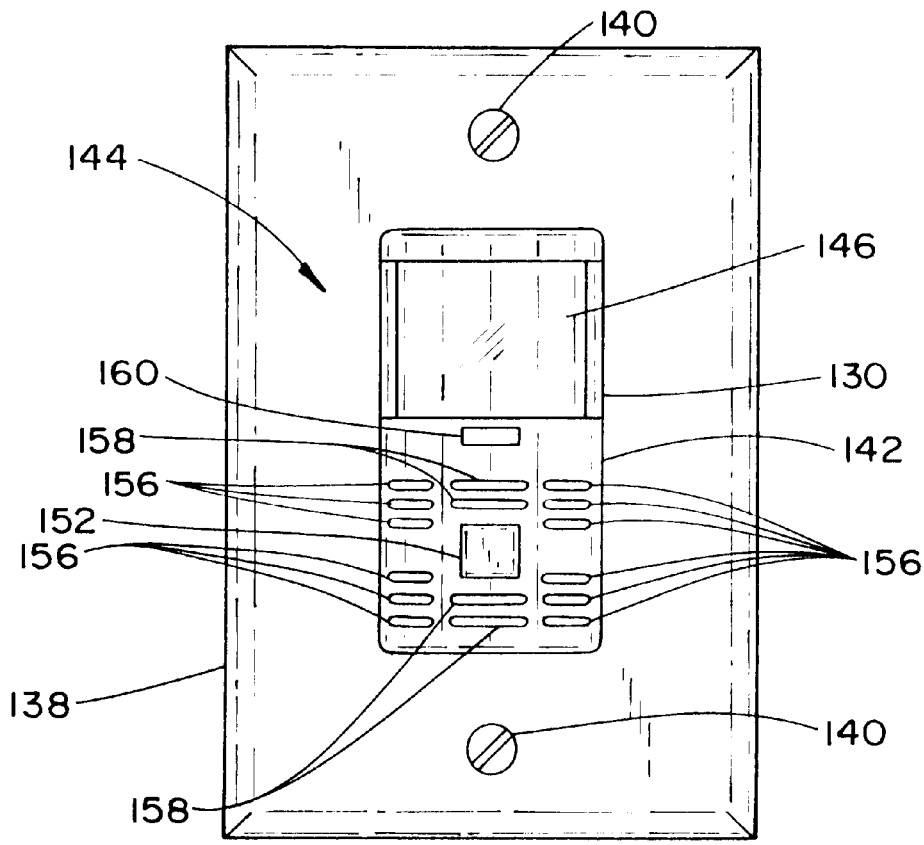
FIGS. 14 and 15 are respectively a front elevational view and a bottom planar view of the unit of FIG. 13.
Figure 15:
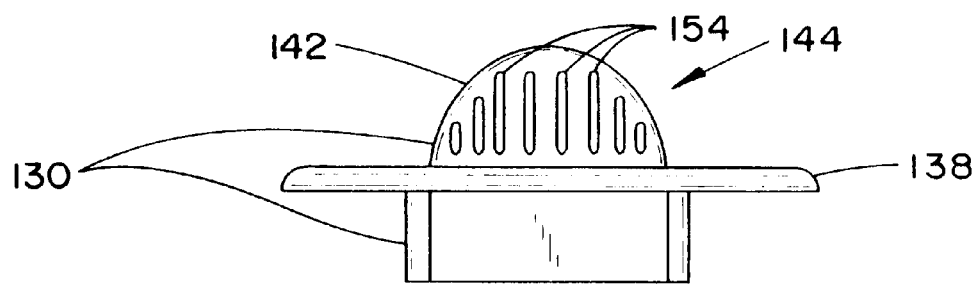

FIG. 13 is a front perspective view of a wallswitch-mounted temperature and passive infrared sensor unit. 130, while FIGS. 14 and 15 are respectively a front elevational view and a bottom planar view of the unit 130 of FIG. 13 with a front cover wallplate in place thereon. The sensor module 130 is a wallswitch mounted design wherein most of the body of the unit is designed to be mounted within a typical wallswitch electrical outlet box. The housing for the sensor module has a two piece construction having a front housing 132 and rear housing 134, and the housing is designed to be mounted within a wall switch electrical outlet box by screws which extend through protecting ears or lugs 136 on a mounting bridge or yoke for the sensor module into threaded openings in the outlet box. A front cover wallplate 138 is then placed over the mounted multifunction unit, and is secured in place by two screws 140 which extend into threaded openings in the projecting lugs 136, as shown in FIG. 14.

Figure 16:
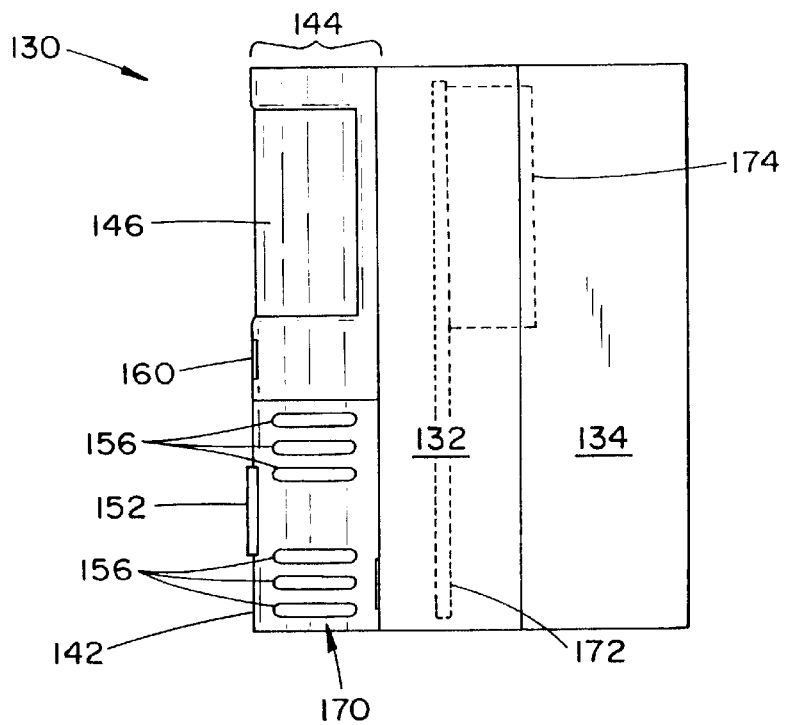
FIG. 16 is a side elevational view of the sensor module without a mounting bridge and wallplate.
Figure 17:
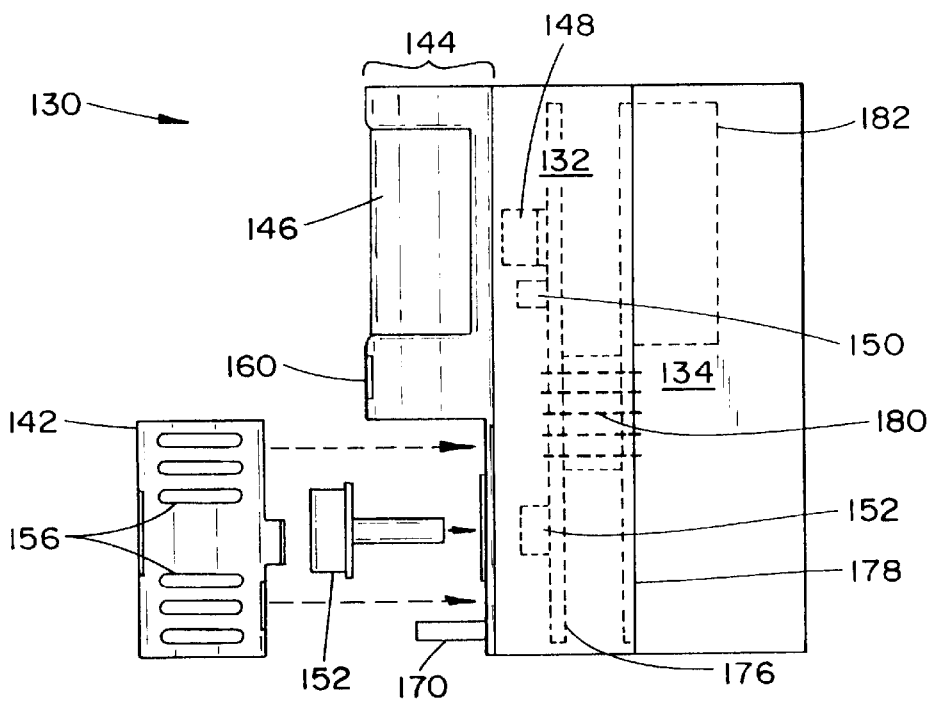
FIG. 17 is an exploded view similar to FIG. 15 but with a front clip-in door removed therefrom.

FIG. 16 is a side elevational view of the wallswitch-mounted sensor module enclosure without a mounting bridge and cover wallplate, and FIG. 17 is an exploded view similar to FIG. 16 but with a front clip-in door 142 removed therefrom. In a mounted position, a projecting semi-cylindrical front 144 of the sensor module projects forwardly through a rectangular hole in the cover wallplate 138, as illustrated in FIGS. 14 and 15, and is designed to present an aesthetically attractive appearance.

Figure 18:
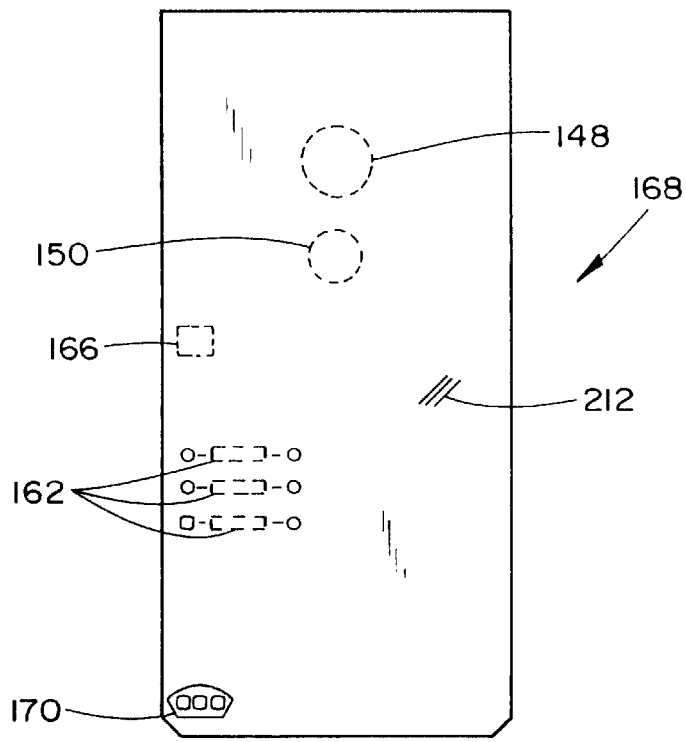
FIG. 18 is a top planar view of one side of a PC board of the sensor unit, and illustrates the PIR sensor mounted thereon, and the temperature sensor mounted at a bottom corner of the electrical lead side of the PC board, as far as possible from heat generating electrical components mounted near the middle and top of the opposite component side of the PC board.

The top half of the semi-cylindrical projection has a curved window 146, behind which a PIR lens and PIR sensor 148, FIG. 18, and an ambient light sensor 150 are positioned.

The bottom half of the semi-cylindrical projection is formed by a removable clip-in door 142 having a front press switch/override actuator button 152 in the center thereof which is used for functions such as on/off, override, test, dim, etc. The clip-in door 142 is provided with air vent slots 154 in the bottom, as illustrated in FIG. 15, air vent slots 156 in the left and right sides, and air vent slots 158 above and below the press switch 152.

An LED 160, which signals motion detection and is also used in service operations, is positioned centrally between the upper window 146 and the lower clip-in door 142.

The present invention recognizes that a certain amount of heat is generated by the circuit components in the sensor module housing, and should be dissipated while minimally adversely affecting and causing any error in the temperature measured by the temperature sensor. This results in a temperature offset between the actual ambient temperature and the measured temperature, which should be minimized. Major heat generating components include the current limiting resistors 162 and the voltage regulator 166, which are mounted on the opposite component side of the PC board 168 shown in FIG. 18, and accordingly are illustrated in phantom in FIG. 18.

To the extent practible, these heat generating components are mounted as high as practical on the PC board 168, as heat rises, and a temperature sensor 170 is mounted as far therefrom as possible, preferably at a bottom corner on the opposite solder or electrical lead side of the PC board, as illustrated in FIG. 18. For practical considerations in the layout of the PC board, these heat generating components are preferably mounted above the lower third of the PC board.

FIG. 18 is a top planar view of the front electrical lead side of the PC board 168, and illustrates the Passive Infrared (PIR) sensor 148 and ambient light sensor 150 mounted thereon, to be positioned behind the curved window 146 in an assembled position. The temperature sensor 170 is mounted at a bottom corner of the PC board, as far as possible from the heat generating electrical components, which for practical reasons are mounted above the lower third of the PC board. The temperature sensor 170 projects from the lower left corner of the Printed Circuit Board (PCB) 168, as illustrated in FIGS. 17 and 18, such that it projects into the enclosed space behind the clip-in door 142 with its most sensitive measurement surface optimally positioned facing downwardly in this instance.

The major heat generating components on the PC board 168, including the current limiting resistors 162 and the voltage regulator 166, are mounted on the opposite back side of the board shown in FIG. 18, above the temperature sensor, as heat rises. The PIR sensor 148 is positioned centrally near the top of the PC board 168 behind the curved window 146.

FIG. 16 illustrates a first embodiment of the present invention wherein a single PC board 172 is utilized, and the temperature sensor 170 is shown projecting forwardly from a bottom corner of the front electrical-lead side thereof to a mounted position behind the air vented clip-in door 142. Major heat generating electrical components in a power supply thermal area 174 are positioned relatively high up on the opposite component side of the PC board 172.

FIG. 17 illustrates a second embodiment of the present invention very similar to the embodiment of FIG. 16, but wherein a first front printed circuit board 176 mounts the temperature sensor 170 at a bottom front corner thereof, and mounts the PIR detector 148 and the ambient light sensor 150 centrally behind the top window 146 thereof. A second back printed circuit board 178 is mounted behind the first printed circuit board 176, is connected thereto by an electrical header 180. Major heat generating electrical components are mounted on the rear side of the second PC board 178 in a power supply thermal area 182. Thus, the heat generating electrical components are mounted separated from the temperature sensor 170 and the PIR sensor 148 by both of the first and second PC boards 176, 178.

Figure 19:
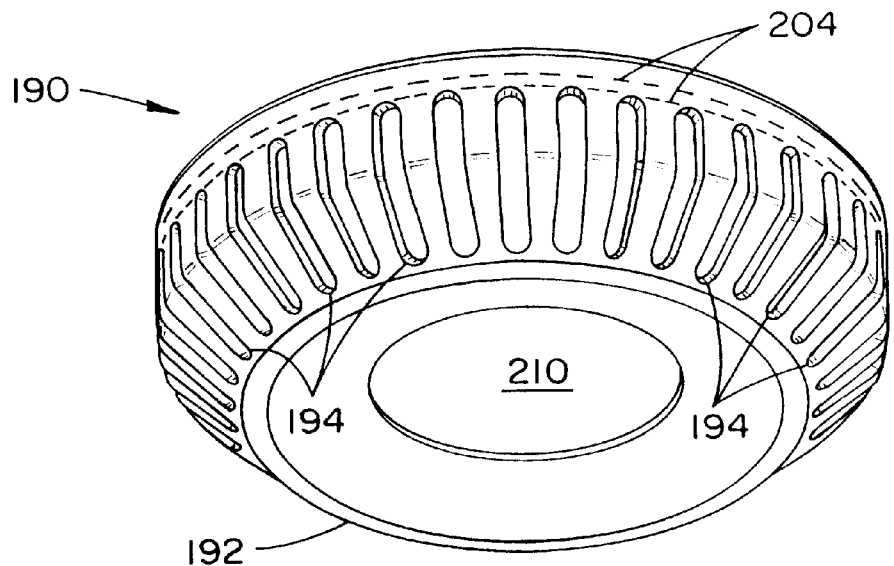
FIGS. 19 and 20 are respectively bottom and top perspective views of a round ceiling-mounted sensor module housing.
Figure 20:
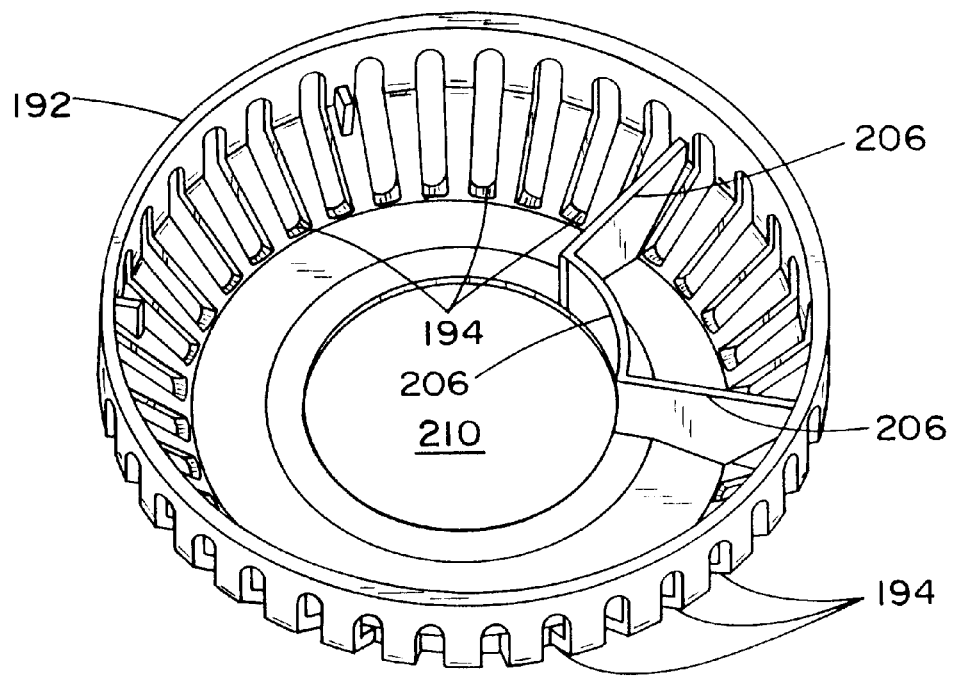

FIGS. 19 and 20 are respectively bottom and top perspective views of a round ceiling-mounted sensor module 190 which has a deep dish shaped circular housing 192 which is provided with vertical air vents 194 regularly spaced around its circumference.

Figure 21:
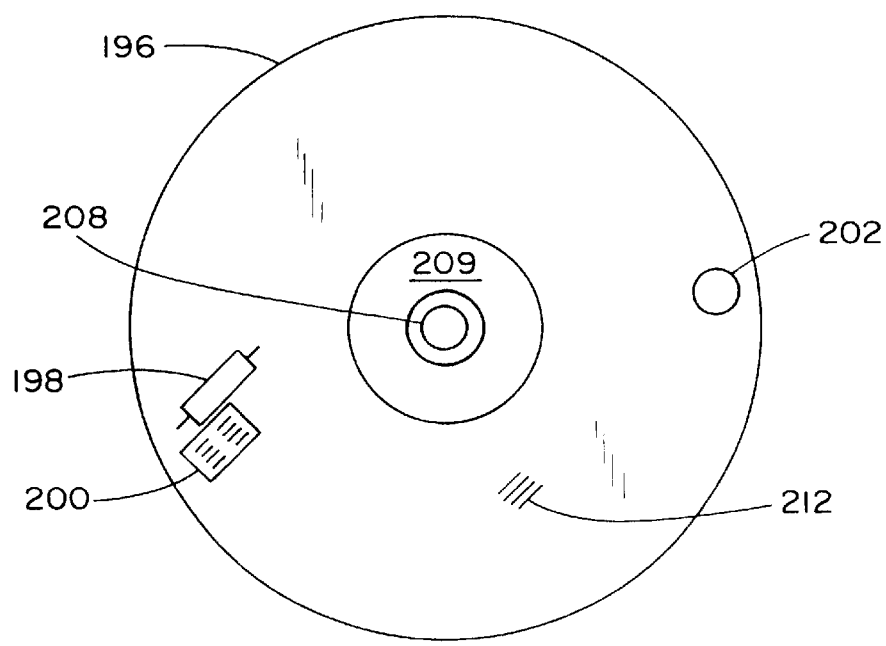
FIG. 21 is a top plan view of the mounting PC board of the ceiling-mounted sensor module of FIGS. 19 and 20, which has a circular configuration, and wherein the heat generating electrical components are mounted on one radial side of the circular PC board, and the temperature sensor is mounted on the opposite radial side thereof as far away therefrom as possible.

FIG. 21 is a top plan view of the mounting PC board 196 of the ceiling-mounted sensor module which has a circular configuration, and wherein major heat generating electrical components, including a current limiting resistor 198 and voltage regulator 200, are mounted on one radial side of the circular PC board 196, and the temperature sensor 202 is mounted on the opposite radial side thereof, as far away therefrom as possible. The temperature sensor 202 is mounted near the edge of the PC board 196 in an area of maximum louver vent openings 194. The circumferential edges 204 of the PC board 194 are illustrated in phantom in FIG. 19, to illustrate that the air vent slots 194 extend to the surface of the PC board 196. An internal partition 206 is provided on the inside of the housing 192 which extends around and encloses the temperature sensor 202, to further isolate it from the heat generating components 198, 200 on the PC board 194. A PIR sensor 208 is mounted on the PC board 196 behind a central window 210 of the sensor module housing 192, and includes a spaced annular ring of insulation 209 placed around and spaced from the PIR sensor 208.

Particularly in embodiments of the sensor module which are open to a substantial flow of ambient air, a plastic conformal coating 212 is preferably coated over the PC board which provides electrical and thermal insulation and physical protection for the coated components, provides thermal insulation for the PIR sensor, and protects the coated components from moisture. The plastic conformal coating also assists in obtaining certification and approval by testing and rating agencies such as UL and CE.

While several embodiments and variations of the present invention for a temperature and passive infrared sensor module are described in detail herein, it should be apparent that the disclosure and teachings of the present invention will suggest many alternative designs to those skilled in the art.

What is claimed is:
1. A temperature and passive infrared sensor comprising:
   a. a sensor module housing having air flow vents therein to allow air to circulate through the sensor housing;
   b. a temperature sensor for detecting temperature;
   c. a passive infrared sensor for detecting passive infrared radiation;

d. a printed circuit board defining a front electrical lead side, and an opposite back electrical component side, wherein the printed circuit board is positioned in the sensor module housing extending in a substantially vertical direction such that the printed circuit board defines upper and lower sections of both the front electrical lead side and the opposite back electrical component side thereof, the printed circuit board having heat generating electrical components mounted thereon on the back component side of the printed circuit board, and the temperature sensor and the passive infrared sensor are mounted on the front electrical lead side of the printed circuit board, such that the printed circuit board shields the temperature sensor and the passive infrared sensor from the heat generating components, and wherein the temperature sensor is mounted on a lower section of the electric lead side of the printed circuit board.

2. A temperature and passive infrared sensor as claimed in claim 1, wherein the sensor has a projecting semi-cylindrical front projecting forwardly therefrom.

3. A temperature and passive infrared sensor as claimed in claim 1, wherein the sensor comprises a wallswitch-mounted unit which is designed to be mounted in a wallswitch electrical outlet box with a projecting semi-cylindrical front of the sensor projecting forwardly therefrom.

4. A temperature and passive infrared sensor as claimed in claim 3, wherein the sensor is mounted within the wallswitch electrical outlet box by screws which extend through projecting lugs on the sensor into threaded openings in the outlet box.

5. A temperature and passive infrared sensor as claimed in claim 3, wherein a top section of the projecting semi-cylindrical front has a front curved window, behind which the passive infrared sensor is positioned.

6. A temperature and passive infrared sensor as claimed in claim 5, wherein an ambient light sensor is also positioned behind the front curved window.

7. A temperature and passive infrared sensor as claimed in claim 3, wherein a bottom section of the projecting semi-cylindrical front is formed by a removable clip-in door.

8. A temperature and passive infrared sensor as claimed in claim 7, wherein air flow vents are provided in a bottom surface and in projecting front and side surfaces of the clip-in door to provide a circulating air flow around the temperature sensor.

9. A temperature and passive infrared sensor as claimed in claim 7, wherein the temperature sensor is mounted on the printed circuit board to project into the enclosed space behind the clip-in door.

10. A temperature and passive infrared sensor as claimed in claim 7, wherein an LED, which signals motion detection and is also used in service, is positioned centrally above the lower clip-in door.

11. A temperature and passive infrared sensor as claimed in claim 1, wherein a plastic conformal coating is deposited over the printed circuit board and components mounted thereon to provide electrical and thermal insulation and physical protection for the coated components, provide thermal insulation for the passive infrared sensor, and to protect the coated components from moisture.

12. A temperature and passive infrared sensor as claimed in claim 1, wherein the passive infrared sensor and the temperature sensor are mounted projecting from the front electrical lead side of the printed circuit board.

13. A ceiling mounted temperature and passive infrared sensor comprising:

a. a circular sensor housing having vertically elongated air flow vents spaced around its circumference to allow air to circulate through the sensor housing;

b. a temperature sensor for detecting temperature;

c. a passive infrared sensor for detecting passive infrared radiation;

d. a circular printed circuit board mounted substantially horizontally in a circular sensor module housing, wherein the printed circuit board has heat generating electrical components mounted thereon on a first circumferential side of the printed circuit board, and the temperature sensor is mounted on a second opposite circumferential side of the printed circuit board, such that the temperature sensor is mounted as far as practical from the heat generating components.

14. A temperature and passive infrared sensor as claimed in claim 13, wherein the temperature sensor is mounted at a circumferential edge of the printed circuit board directly adjacent to the air flow vents which extend to a mounting surface of the printed circuit board.

15. A temperature and passive infrared sensor as claimed in claim 13, wherein the sensor housing includes an internal partition on the inside of the sensor housing which extends around and encloses the temperature sensor, to further isolate the temperature sensor from heat generating components on the printed circuit board.

16. The temperature and passive infrared sensor as claimed in claim 13, wherein the passive infrared sensor is mounted near the center of the circular printed circuit board and is mounted behind a central window of the sensor housing.

* * * * *